(12) United States Patent
Mark et al.

(10) Patent No.: US 7,923,892 B2
(45) Date of Patent: Apr. 12, 2011

(54) SWITCH FOR A BRUSH WEAR RECORDING CIRCUIT

(75) Inventors: Bernhard Mark, Waldshut (DE); Max Hobelsberger, Wuerenlingen (CH)

(73) Assignee: Alstom Technology Ltd, Baden (CH)

( * ) Notice: Subject to any disclaimer, the term of this patent is extended or adjusted under 35 U.S.C. 154(b) by 182 days.

(21) Appl. No.: 12/429,764

(22) Filed: Apr. 24, 2009

(65) Prior Publication Data

US 2009/0267444 A1   Oct. 29, 2009

(30) Foreign Application Priority Data

Apr. 25, 2008  (EP) .................................. 08155159

(51) Int. Cl.
*H01R 39/38* (2006.01)
*H02K 13/00* (2006.01)
(52) U.S. Cl. ......... 310/242; 310/244; 310/245; 310/249
(58) Field of Classification Search .................. 310/242, 310/244, 245–249
See application file for complete search history.

(56) References Cited

U.S. PATENT DOCUMENTS

| | | | |
|---|---|---|---|
| 2,193,172 A | | 3/1940 | Hills |
| 4,272,695 A | * | 6/1981 | Buchwald et al. ............. 310/242 |
| 4,348,608 A | * | 9/1982 | Michael ......................... 310/242 |
| 4,451,786 A | | 5/1984 | Sawada et al. |
| 4,488,078 A | * | 12/1984 | Orton ............................ 310/242 |

FOREIGN PATENT DOCUMENTS

| | | |
|---|---|---|
| CA | 1194112 | 9/1985 |
| DE | 3417711 | 11/1985 |
| DE | 8600934 | 4/1986 |
| DE | 19758235 | 4/1999 |
| EP | 1801938 | 6/2007 |
| GB | 1215649 | 12/1970 |
| GB | 1564384 | 4/1980 |
| GB | 2300311 | 10/1996 |
| JP | 6141513 | 5/1994 |
| JP | 07274445 | 10/1995 |

OTHER PUBLICATIONS

Co-pending U.S. Appl. No. 12/429,664, filed on Apr. 24, 2009 entitled "Switch for a Brush Wear Recording Circuit".*
European Search Report for EP 08155159 mailed Dec. 30, 2008.
Co-pending U.S. Appl. No. 12/429,627, filed Apr. 24, 2009, entitled "Brush wear monitor".

* cited by examiner

*Primary Examiner* — Quyen Leung
*Assistant Examiner* — Alex W Mok
(74) *Attorney, Agent, or Firm* — Leydig, Voit & Mayer, Ltd.

(57) ABSTRACT

A switch for a recording circuit used to determine brush wear of an electrical brush comprises a flag having a first end and a second end defining distal ends of the flag. The flag is mounted on the electrical brush at the first end so as to move in unison with brush wear while being in electrical communication with the electrical brush and has a piercing feature on the second end. The switch further comprises a contact plate arrange relative to the flag so as to bring the flag in contact with the contact plate at a predetermined brush wear and includes an inner conductive core encased by a cover forming an outer layer of the contact plate, wherein the piercing feature is configured to penetrate the cover and to contact the conductive core to cause electrically continuous contact between the flag and the contact plate and close the switch.

6 Claims, 2 Drawing Sheets

SWITCH FOR A BRUSH WEAR RECORDING CIRCUIT

Priority is claimed to European Application No. EP 08155159.0, filed on Apr. 25, 2008, the entire disclosure of which is incorporate by reference herein.

The invention relates to brushes used for transferring current in electrical machines, such as electric motors or alternators, and to recording systems used to measure or determine the wear of these brushes. More specifically, the invention relates to switches for brush wear recording systems that rely on brush flags to initiate brush wear alarms through electrical contact.

BACKGROUND

Brush gear mechanisms are used extensively in certain motors, generators and other rotating electrical machinery to conduct current between stationary and rotating parts (commutators or slip rings). To avoid or at best minimise the wear of the rotating parts, which are typically constructed of copper or brass, brushes are made of soft materials, such as carbon and graphite, so as to preferentially wear. It is important that brush wear is monitored to ensure that the brushes do not wear beyond a minimum level as a completely worn brush can lead to electrical arcing resulting in machine part failure.

There are a number of techniques and methods known for the measurement and determination of brush wear. One such technique involves the closing of a switch, by flags or projections located on the brush, by movement resulting from the brush wear. An example is provided in the German Patent No. DE 34 17 711 A1. Another example is provided in German Patent No. DE 86 00 934 U1. A problem with brush wear monitoring methods utilising brush flag switches is that dust created by the wearing of brush creates a dirty environment in the brush housings in which brush are located. This dust can interfere with the operation and reliability of the switching operation.

SUMMARY OF THE INVENTION

An aspect of the present invention is to provide a means to overcome the problem of dust fouling in brush wear houses affecting operation of brush wear switches that forms part of brush wear recording circuit.

The invention is based on the general idea of providing a switch that includes a covered contact plate. The switch is closed by penetration of the cover by a flag thereby creating electrically continuous contacts between the contact plate and flag. The cover ensures the reliably of the switching independent of the degree of brush dust foulant in the brush housing.

Accordingly, provided is a switch for a recording circuit used to determine brush wear of an electrical brush wherein the switch comprises a flag and a contact plate. The flag has a first end and a second end defining distal ends of the flag and is mounted on a brush at the first end so as to move with brush wear while being in electrical communication with the brush. The mounting may be such that the flag moves by the amount the brush is worn i.e. in unison. Towards the second end of the flag is a piercing feature. The contact plate is configured and arranged relative to the flag such that at a predetermined brush wear the flag is brought in contact with the contact plate by brush wear thereby closing the switch. The contact plate further comprises an inner conductive core that is encased by a cover that forms an outer layer of the contact plate. The arrangement of flag and contact plate is such that the piercing feature of the flag is capable of penetrating the cover so as to cause electrically continuous contact between the flag and the contact plate by contacting of the conductive core.

Preferably the cover also includes a sealable slot arranged such that the piercing feature penetrates the cover through the sealable slot so by reducing the stress imposed on the flag by the piercing action.

Typically the cover is made of deformable material wherein the deformable property of the material provides the sealable slot with the capability to seal. The deformable property of the cover may also enable the non-destructive penetration of the slot by the piercing feature whereby the slot is capable of resealing, through memory properties of the cover, when the penetrating feature is withdrawn from the slot. This resealing enables the reuse of the contact plate.

In a further aspect the switch comprises a plurality of flags wherein the contact plate and the plurality of flags are configured and arranged such that the plurality of flags are capable of electrically continuous contact with the conductive core of a single contact plate. This provides a simplified arrangement wherein a plurality of flags can be monitored by a single circuit without interference from dust accumulation in the brush housing.

Other objectives and advantages of the present invention will become apparent from the following description, taken in connection with the accompanying drawings wherein by way of illustration and example, an embodiment of the invention is disclosed.

BRIEF DESCRIPTION OF THE DRAWINGS

By way of example, an embodiment of the invention is described more fully hereinafter with reference to the accompanying drawings, in which.

DETAILED DESCRIPTION

Figure 1:
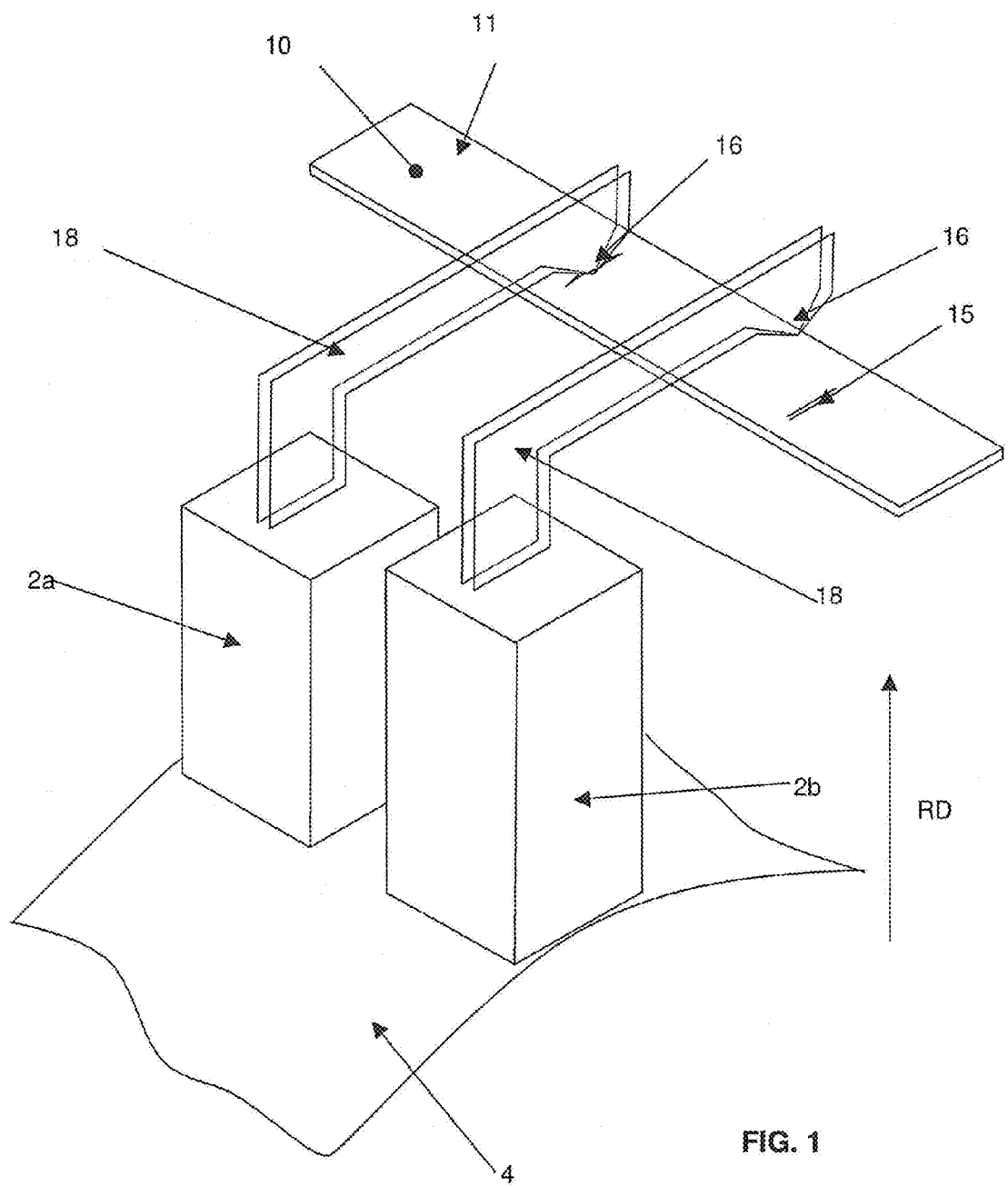
FIG. 1 is a schematic view of a brush monitor switching of the invention.

Preferred embodiments of the present invention are now described with reference to the drawings, wherein like reference numerals are used to refer to the elements throughout. In the following description, for purposes of explanation, numerous specific details are set forth in order to provide a thorough understanding of the invention. It may be evident, however, that the invention may be practiced without these specific details.

Figure 2:
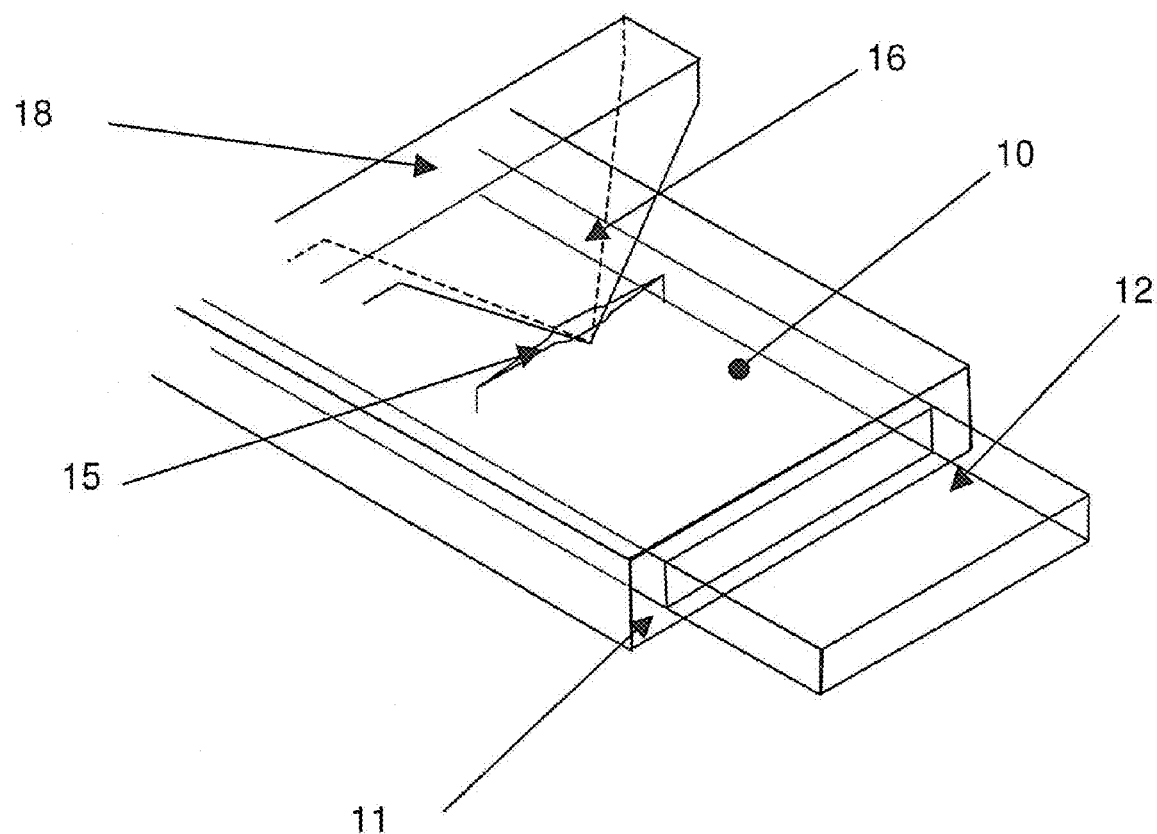
FIG. 2 is an expanded view of the contact arrangement of the switch of FIG. 1

FIGS. 1, and 2 show details of a switching system suitable for use in a recording circuit used to determine the brush wear of an electrical brush 2a, 2b.

FIG. 1 shows two brushes 2a, 2b of an electrical machine, in different wear states. The brushes 2a, 2b are typical of those used extensively in certain motors, generators and other rotating electrical machinery to conduct current between stationary and rotating parts 4 (commutators or slip rings). The blushes 2a, 2b, which are stationary are worn by frictional contact with the rotating parts 4. This results in a decrease in the length of the brush 2a, 2b in the radial direction RD.

A flag 18 is mounted onto each brush 2a, 2b at a first end of the flag, in such a way that the flag 18 moves, preferably in unison, with the brush 2a, 2b and the flag 18 is in electrical communication with the brush 2a, 2b. Unison, in the sense of this specification means moved in the radial direction RD by the same amount the brush 2a, 2b wears. For example, if the brush 2a, 2b wears 1 mm, the radial distance between the flag 18 and rotating part 4 decreases by the same 1 mm. While the flag 18 is shown as being mounted on top of a brush 2a, 2b, it could equally be mounted on the side of the brush 2a, 2b or along the length of the brush 2a, 2b in the radial direction RD or any other conceivable arrangement that provides that the flag 18 moves by the amount the brush 2a, 2b is worn while remaining in electrical communication with the brush 2a, 2b.

In an exemplary embodiment, a piercing feature 16 is located on the flag 18 towards a second end of the flag 18, distal from the first flag end. In an exemplary embodiment, the piercing features 16 consist of a sharpened point. In another, not shown exemplary embodiment, the piercing feature consist of a sharpened edge. The piercing feature 16 may take other forms that give the flag 18 the capability of penetrating a cover 11 forming the outer layer of the contact plate 10.

The flag 18 and the contact plate 10 are arranged such that when the brush 2a 2b is worn by a predetermined amount, the piercing feature 16 is brought into electrically continuous contact with the contact plate 10 by the flag 18 piercing a cover 11 covering the contact plate 10, as shown in FIG. 1. The piercing, in an exemplary embodiment, is through a sealable slot 15, wherein the slot is made sealable by the cover 11 being made of deformable material such that when the sealable slot 15 is not being pierced the sealable slot 15 seals itself. In this way the cover 11 is pierced non-destructively ensuring continuous protection of the conductive core 12 of the contact plate 10, as shown in FIG. 2.

The combination of flag 18 and contact plate 10 perform the function of a switch such that contact between a flag 18 with the contact plate 10 closes the switch by enabling current flow from the brush 2a to the contact plate 10. This contact may be utilised, in conjunction with known brush wear circuits (not shown), to provide a brush wear alert.

In the exemplary embodiment, shown in FIG. 1, the contact plate 10 extends past more than one flag 18 such that contact between the contact plate 10 and more than one flag 18 is possible. In this way a single contact plate 10 can be used to monitor more than one brush 2a, 2b so by simplifying the monitoring system by reducing the need for duplication of the brush wear monitoring circuit (not shown).

FIG. 2 shows an expanded view of the flag 18 and contact plate 10 of FIG. 1, showing a worn brush 2a making contact with a contact plate 10. In addition, a cut through view of an end of the contact plate 10 shows the inner conductive core 12 of the contact plate 10 and the cover 11 that forms the contact plates 10 outer layer.

To ensure that the conductive core 12 remains dust free during use and the penetration of the flag 18 through the cover does not impart excessive stress on the flag 18 as it pierces the cover 11, in an exemplary embodiment, the cover 11 has sealable slots 15 located on and extending through the cover 1. These sealable slots 15 are arranged such that piercing features 16 of the flags 18 penetrate the cover only through the sealable slots 15.

Sealable slots 15 are made sealable by the cover 11 being made of deformable material, for example, rubber or plastic, which have a memory. In this way sealable slots 15 are dust tight when not being penetrated and yet can be non-destructively penetrated by piercing features 16 such that they return to the original sealed state when the piercing feature 16 is withdrawn.

Although the invention has been herein shown and described in what is conceived to be the most practical and preferred embodiment, it is recognized that departures can be made within the scope of the invention, which is not to be limited to details described herein but is to be accorded the full scope of the appended claims so as to embrace any and all equivalent devices and apparatus.

REFERENCE NUMBERS

Numbers Used in the Figures

2a Worn brush
2b Unworn brush
4 Rotating part
10 Contact plate
11 Cover
12 Conductive core
15 Sealable slot
16 Piercing feature
18 Flag
RD Radial direction

What is claimed is:

1. A switch for a recording circuit used to determine brush wear of an electrical brush comprising:
    a flag having a first end and a second end defining distal ends of the flag, the flag being mounted on the electrical brush at the first end so as to move in unison with brush wear while being in electrical communication with the electrical brush, the flag further having a piercing feature at the second end; and
    a contact plate arranged relative to the flag so as to bring the flag in contact with the contact plate at a predetermined brush wear, the contact plate including an inner conductive core encased by a cover forming an outer layer of the contact plate, wherein the piercing feature is configured to penetrate the cover and to contact the conductive core to cause electrically continuous contact between the flag and the contact plate and close the switch.

2. The switch as recited in claim 1, wherein the cover includes a sealable slot disposed on the contact plate such that the piercing feature penetrates the cover through the sealable slot.

3. The switch as recited in claim 2, wherein the cover includes a deformable material, the deformable material having a deformable property capable of sealing the sealable slot.

4. The switch as recited in claim 3, wherein the deformable property enables a non-destructive penetration of the slot by the piercing feature and enables the sealable slot to reseal when the penetrating feature is withdrawn from the sealable slot.

5. The switch as recited in claim 1, wherein a movement of the flag corresponds to an amount of brush wear.

6. The switch as recited in claim 1, further comprising a plurality of flags, wherein the contact plate and the plurality of flags are arranged such that the plurality of flags is configured to be capable of electrically continuous contact with the conductive core of the single contact plate.

* * * * *